US007709997B2

(12) United States Patent
Nudelman et al.

(10) Patent No.: US 7,709,997 B2
(45) Date of Patent: May 4, 2010

(54) MULTI-ELEMENT PIEZOELECTRIC TRANSDUCERS

(75) Inventors: Igor Nudelman, Herzliya (IL); Andrey Rybyanets, Yoqneam (IL)

(73) Assignee: Ultrashape Ltd., Yoqneam Illite (IL)

( * ) Notice: Subject to any disclaimer, the term of this patent is extended or adjusted under 35 U.S.C. 154(b) by 0 days.

(21) Appl. No.: 12/076,036

(22) Filed: Mar. 13, 2008

(65) Prior Publication Data

US 2009/0230820 A1 Sep. 17, 2009

(51) Int. Cl.
*H01L 41/09* (2006.01)

(52) U.S. Cl. ....................................... 310/317; 310/314

(58) Field of Classification Search ................. 310/314, 310/317, 318, 367, 371
See application file for complete search history.

(56) References Cited

U.S. PATENT DOCUMENTS

| | | | | |
|---|---|---|---|---|
| 1,840,580 | A * | 1/1932 | Heising | 331/160 |
| 2,645,727 | A * | 7/1953 | Willard | 310/361 |
| 5,111,805 | A | 5/1992 | Jaggy et al. | |
| 5,298,828 | A * | 3/1994 | Radovanovich | 310/319 |
| 5,316,000 | A | 5/1994 | Chapelon et al. | |
| 6,807,859 | B2 * | 10/2004 | Tabota | 73/514.34 |
| 6,820,313 | B2 * | 11/2004 | Gauchet | 29/25.35 |

FOREIGN PATENT DOCUMENTS

JP 60-160299 * 8/1985

OTHER PUBLICATIONS

U.S. Appl. No. 11/870,445, filed Oct. 11, 2007, Rybyanets.

* cited by examiner

*Primary Examiner*—Thomas M Dougherty
(74) *Attorney, Agent, or Firm*—Fennemore Craig, P.C.

(57) ABSTRACT

A piezoelectric transducer formed of a body of piezoelectric material having first and second opposed sides and first and second electrically conductive layers on the first and second sides respectively of the piezoelectric body, wherein the piezoelectric body and the electrically conductive layers are so constructed that they form a plurality of separate adjacent series-connected transducer elements. A method of manufacturing such a transducer is also disclosed. The piezoelectric body may have a substantially uniform direction of polarization, or alternating zones of opposite polarization. The conductive layers may be continuous or discontinuous, together forming isolated electrode pairs to define the individual transducer elements. The elements can be hard wired or connected through a switching circuit to display either circumferential or axial or other ultrasonic focal patterns, and may be connected in a parallel, rather than a series configuration. When connected in series, advantageously higher impedance can be obtained, compared to the parallel configuration.

26 Claims, 9 Drawing Sheets

MULTI-ELEMENT PIEZOELECTRIC TRANSDUCERS

FIELD

The present invention relates to multi-element piezoelectric transducers.

BACKGROUND

Piezoelectric transducers capable of generating pulses of ultrasonic energy, e.g., sound waves, in response to an electrical excitation are formed of one or more bodies of piezoelectric material, usually a ceramic such as Lead Zirconate Titanate (PZT), with electrodes on opposite sides for coupling to an electric power supply. Such transducers have many applications, including in the medical field. Among the medical applications are ultrasound imaging, lithotripsy, i.e., using ultrasound pulses to break up kidney stones or the like, and lysing or destroying the cell walls of adipose/cellulite tissue for cosmetic procedures, generally by causing cavitation in the tissue.

For such medical and cosmetic purposes, it is often desirable to be able to focus the ultrasonic output of the transducer. To achieve this, the transducers are often comprised of a cup-shaped piezoelectric ceramic shell and conductive layers forming electrodes covering the convex outside and concave inside of the piezoelectric shell. Typically, the transducers are hemispherical, with the "open end", i.e., the equatorial plane positioned toward the subject being treated.

The transducer is excited to vibrate and generate ultrasound by pulsing it using an AC power supply generally operating at a resonant frequency of vibration of the piezoelectric material.

A hemispherical transducer in which the conductive surfaces define a single electrode pair exhibits an "axial focal pattern". This is an ellipsoidal pattern having a relatively small cross section and relatively long axis coincident with a "longitudinal" axis of the transducer, i.e., a line through the center of rotation of the transducer perpendicular to the equatorial plane.

SUMMARY OF THE INVENTION

According to some embodiments of the invention, there is provided a transducer divided into a plurality of transducer elements, adapted to be simultaneously excited with AC voltages having different phases. FIG. 1 is a perspective drawing, with a portion cut away, which shows the structure of a multi-element, cup-shaped focusing transducer 100 in schematic form. Transducer 100 is comprised of a shaped ceramic body 110, and bottom and top layers forming electrically conductive surfaces 114 and 116, respectively, on the concave inner and convex outer sides 106 and 108 of body 110. Surfaces 114 and 116 may comprise conductive metal layers painted onto or otherwise applied to ceramic body 110, e.g., by spraying or by dripping conductive paint onto the piezoelectric body 110 while spinning it. A longitudinal axis of the transducer is indicated at 130. The equatorial plane is indicated at 132.

For simplicity, transducer 100 will be described as hemispherical, and its features will be described in that context. It should be understood, however, that the transducer can be configured as an essentially flat panel, a cylinder, a spherical cap, i.e., less than a hemisphere, (sometimes also referred to as a spherical segment), and that other non-spherical configurations are also possible.

The separate transducer elements are optionally created by scoring through the top and bottom conductive surfaces 116 and 114, for example, along meridians of the hemisphere, or in any other desired pattern, to create electrically isolated electrode pairs. In the example shown, transducer 100 is comprised of four transducer elements 118*a*-118*d*. Score lines 120*a*-120*d* extend completely through conductive layer 116 to form spherical triangles that define outer electrodes 116*a*-116*d* respectively. Similar score lines (not visible in FIG. 1) extending completely through inner conductive layer 114, and aligned with score lines 120*a*-120*d*, define the inner electrodes. An axial opening 124 at the top pole of the transducer body is ordinarily also provided to facilitate manufacturing, and to allow insertion of other medical instruments or sensors during use.

Appropriate wiring (not shown) connects the respective electrode-pairs to a suitable power supply or power supplies. When so configured and connected, the portions of the piezoelectric material between the respective electrode-pairs effectively function as separate transducers. If the exciting voltages for the adjacent transducer elements are of opposite phase, the resulting composite focal pattern is "circumferential", i.e., it exhibits substantially zero ultrasound pressure along transducer axis 130 and peaks in ultrasound pressure for each element symmetrically located along the circumference of a circle having its center along axis 130.

It is often desirable for tissue treatment to generate ultrasound at 1 MHz. However, the resonant frequency of vibration of a transducer as described above is inversely proportional to the thickness of the piezoelectric body. For example, a spherical focusing PZT transducer about 10 cm in diameter having a thickness of about 10 mm typically has a resonant frequency of about 200 KHz. To achieve a resonant frequency of vibration of about 1 MHz, the PZT body should have a thickness of about 2 mm.

The decreased thickness at higher frequencies can present a problem. For a multi-element transducer constructed in the manner described above, each transducer element behaves like a capacitor having electrical impedance inversely proportional to the thickness of the PZT material. The electrical impedance of each transducer element due to such capacitance is relatively low, and is typically about 10 Ohms at a frequency of about 200 KHz. However, for transducers operating at a frequency of about 1 MHz, the impedance of each transducer element is typically about 2 Ohms.

Matching a low impedance load to a power supply designed to drive a relatively high impedance load is generally accomplished by coupling the load to the power supply using a matching circuit. However, matching circuits become increasingly inefficient and wasteful of energy as the difference between the impedance of a load and the impedance for which the power supply is designed increases.

According to some embodiments of the invention, there is provided a piezoelectric transducer comprising a plurality of transducer elements that exhibits relatively high electrical impedance.

According to some embodiments of the invention, there is provided a multi-element piezoelectric transducer in which the transducer elements are electrically connected in series selectively in a first or a second configuration.

In the first configuration, and according to some aspects of the method of the invention, the transducer elements are so connected that a voltage applied to the transducer induces electric fields in the same direction relative to a direction of polarization of the piezoelectric material in all of the transducer elements. These embodiments are sometimes referred to below as "matching field" configurations. Such configurations yield axial focal patterns as described above.

In the second configuration, and according to some embodiments of the method of the invention, the transducer elements are so connected that a voltage applied to the transducer induces electric fields in opposite directions in adjacent transducer elements relative to a direction of polarization of the piezoelectric material in the transducer. These embodiments are sometimes referred to below as "alternating field" configurations. Such configurations yield circumferential focal patterns as described above.

According to some embodiments of the invention, a switching circuit is provided whereby a series-connected multi-element transducer can be switched between alternating and matching field configurations, thereby selectably providing circumferential or axial focal patterns.

As a consequence of the series connection of the transducer elements in a multi-element transducer, in accordance with an embodiment of the invention, relatively high impedance is obtained for the multi-element transducer compared to that of conventional transducers.

Thus, according to an aspect of the invention, a multi-element piezoelectric transducer is provided which is formed of a body of piezoelectric material having first and second opposed sides, and first and second electrically conductive layers on the first and second sides respectively of the piezoelectric body, wherein the body of piezoelectric material and the electrically conductive layers are so constructed that they form a plurality of separate adjacent series-connected transducer elements.

Optionally, in such a transducer, the transducer elements are so arranged that a potential difference applied thereto generates an electric field in opposite directions in immediately adjacent transducer elements relative to a polarization direction of the piezoelectric material.

Optionally, in such a transducer, the first and second electrically conductive layers are comprised of respective pluralities of first and second electrically isolated portions, respective ones of said first and second electrically isolated portions being aligned to form electrode pairs which cooperate with intervening portions of the piezoelectric body to define the plurality of spaced piezoelectric transducer elements, and the electrodes are so connected together that the transducer elements are connected in a first series configuration in which an applied potential difference generates an electric field in the same direction in each transducer element relative to a polarization direction of the piezoelectric material.

Optionally, in such a transducer, the first and second electrically conductive layers are comprised of respective pluralities of first and second electrically isolated portions, respective ones of said first and second electrically isolated portions are aligned to form electrode pairs which cooperate with intervening portions of the piezoelectric body to define the plurality of spaced piezoelectric transducer elements; and the electrodes are so connected together that the transducer elements are connected in a second series configuration in which an applied potential difference generates electric fields in opposite directions in immediately adjacent transducer elements relative to a polarization direction of the piezoelectric material.

Optionally, in such a transducer, the first and second electrically conductive layers extend substantially continuously over a portion of the body of piezoelectric material, and the adjacent series-connected transducer elements are defined by adjacent zones of alternating polarization direction in the piezoelectric material between the conductive layers.

Optionally, in such a transducer, the piezoelectric body is hemispherical in shape, and the adjacent zones of the piezoelectric body are in the shape of hemispherical triangles separated by spaced meridians of the hemispherical body. Alternatively, the zones are crescent-shaped.

Optionally, in such a transducer, the piezoelectric body is in the form of a spherical cap.

Optionally, in such a transducer, the piezoelectric body is cup-shaped, and the adjacent zones of the piezoelectric body are crescent-shaped. Alternatively, a first zone is in the form of a cap, and other zones are annular.

Optionally, in such a transducer, there is provided a switching arrangement operative to connect the transducer elements together in a matched field configuration or in an alternating field configuration. Optionally, in such a transducer, in the matched field configuration, first and second electrodes of adjacent transducer elements are connected together. Optionally, in such a transducer, in the alternating field configuration, the first electrodes of at least one pair of adjacent transducer elements are connected together. Optionally, in such a transducer, in the alternating field configuration, the electrical connections connect second electrodes of at least one pair of adjacent transducer elements together. Optionally, in such a transducer, in the alternating field configuration, transducer element pairs having their first electrodes connected together are interleaved with transducer element pairs having their second electrodes connected together.

Optionally, in such a transducer, the electrically isolated portions are defined by a plurality of aligned discontinuities between adjacent portions of the conductive layers.

Optionally, in such a transducer, the piezoelectric body is hemispherical in shape, and the aligned discontinuities extend along spaced meridians of the hemispherical body.

According to an aspect of the invention, a piezoelectric transducer is provided which is formed of a shaped body of piezoelectric material, a first electrically conductive layer on a first side of the piezoelectric body, a second electrically conductive layer on a second side of the piezoelectric body which is opposite the first side, the first and second electrically conductive layers being comprised of a plurality of respectively aligned electrically isolated first and second electrode portions forming electrode pairs which cooperate with intervening portions of the piezoelectric body to define a plurality of spaced piezoelectric transducer elements, a plurality of signal paths which connect the transducer elements together, and a switching circuit operable to connect signal paths so the individual transducer elements are selectably connected together in series or in parallel.

Optionally, in such a transducer, the transducer body is cup-shaped, the first electrically conductive layer is on a concave side of the transducer body, and the second electrically conductive layer is on a convex side of the transducer body.

Optionally, in such a transducer, the piezoelectric body is characterized by a direction of polarization, and the switching circuit is operable to connect adjacent transducer elements in an alternating field configuration, or to connect the transducer elements in a matched field configuration, and either in series or parallel for each polarization configuration.

Optionally, in such a transducer, the electrically isolated portions are defined by a plurality of aligned discontinuities between adjacent portions of the conductive layers.

Optionally, in such a transducer, the piezoelectric body is hemispherical in shape, and the aligned discontinuities extend along spaced meridians of the hemispherical body.

Optionally, in such a transducer, the piezoelectric body is in the form of a spherical cap.

Optionally, in such a transducer, the switching circuit is operable to connect the signal paths so the individual transducer elements are selectably connected together in series or in parallel.

According to an aspect of the invention, a method of manufacturing a piezoelectric transducer is provided comprising the steps of forming a body of piezoelectric material having first and second opposed sides, polarizing the material according to a desired pattern, and forming first and second electrically conductive layers on the first and second sides, respectively, of the piezoelectric body, wherein the body of piezoelectric material and the electrically conductive layers are so formed that they define a plurality of separate adjacent series-connected transducer elements.

Optionally, according to such a method, the transducer elements and conductive layers are so formed that a potential difference applied to the conductive layers generates an electric field in opposite directions in immediately adjacent transducer elements relative to a polarization direction of the piezoelectric material.

Optionally according to such a method, the first and second electrically conductive layers are formed by dividing the conductive layers into respective pluralities of first and second electrically isolated portions, the conductive layers are so divided that respective ones of said first and second electrically isolated portions are aligned to form electrode pairs which cooperate with intervening portions of the piezoelectric body to define the plurality of spaced piezoelectric transducer elements, and by connecting the electrodes together so that the transducer elements are connected in a first series configuration in which an applied potential difference generates an electric field in the same direction in each transducer element relative to a polarization direction of the piezoelectric material.

Optionally according to such a method, the first and second electrically conductive layers extend substantially continuously over a portion of the body of piezoelectric material and the adjacent series-connected transducer elements are defined by forming adjacent zones of alternating polarization direction in the piezoelectric material between isolated aligned portions of the conductive layers.

Optionally, according to such a method, the body of piezoelectric material is hemispherical in shape, and the adjacent zones of alternating polarization are in the shape of spherical triangles.

Optionally, according to such a method, the body of piezoelectric material is cup-shaped, and the adjacent zones of alternating polarization are in the shape of triangles, or the adjacent zones of alternating polarization are crescent-shaped, or a first zone of alternating polarization is formed as a cap at a polar region of the cup-shaped body, and other zones of alternating polarization are formed as annuli.

According to an aspect of the invention, a piezoelectric transducer is provided in the form of a body of piezoelectric material having first and second opposed sides, and first and second substantially continuous electrically conductive layers on the first and second sides respectively of the piezoelectric body, wherein the body of piezoelectric material and the electrically conductive layers are so constructed that they form a plurality of separate adjacent connected transducer elements. In a transducer according to this aspect of the invention, the separate transducer elements cooperate to form a circumferential acoustical focal pattern.

According to an aspect of the invention, a method of manufacturing a piezoelectric transducer is provided which comprises forming a body of piezoelectric material having first and second opposed sides, polarizing the material according to a desired pattern, and forming first and second substantially continuous electrically conductive layers on the first and second sides respectively of the piezoelectric body wherein the body of piezoelectric material and the electrically conductive layers are so formed that they define a plurality of separate adjacent connected transducer elements.

BRIEF DESCRIPTION OF THE DRAWINGS

Non-limiting examples of embodiments of the invention are described below with reference to figures attached hereto that are listed following this paragraph. Identical structures, elements or parts that appear in more than one figure are generally labeled with a same numeral in all the figures in which they appear. Dimensions of components and features shown in the figures are chosen for convenience and clarity of presentation and are not necessarily shown to scale.

DETAILED DESCRIPTION OF THE INVENTION

Figure 1:
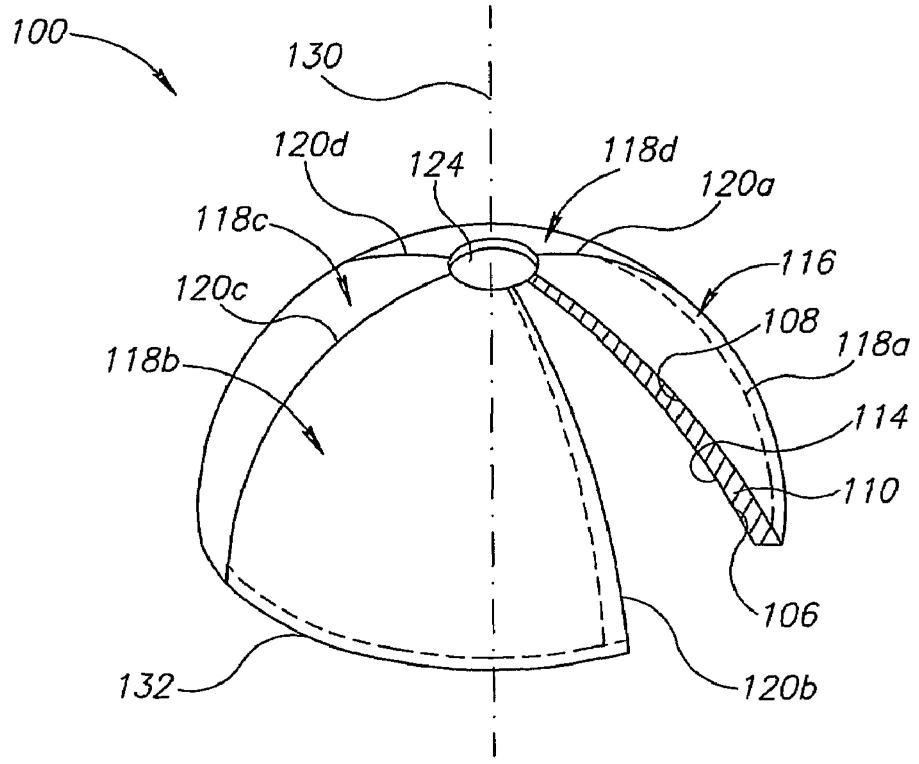
FIG. 1 schematically shows a perspective drawing of a multi-element piezoelectric transducer having a portion cut away to show structural details.
Figure 2:
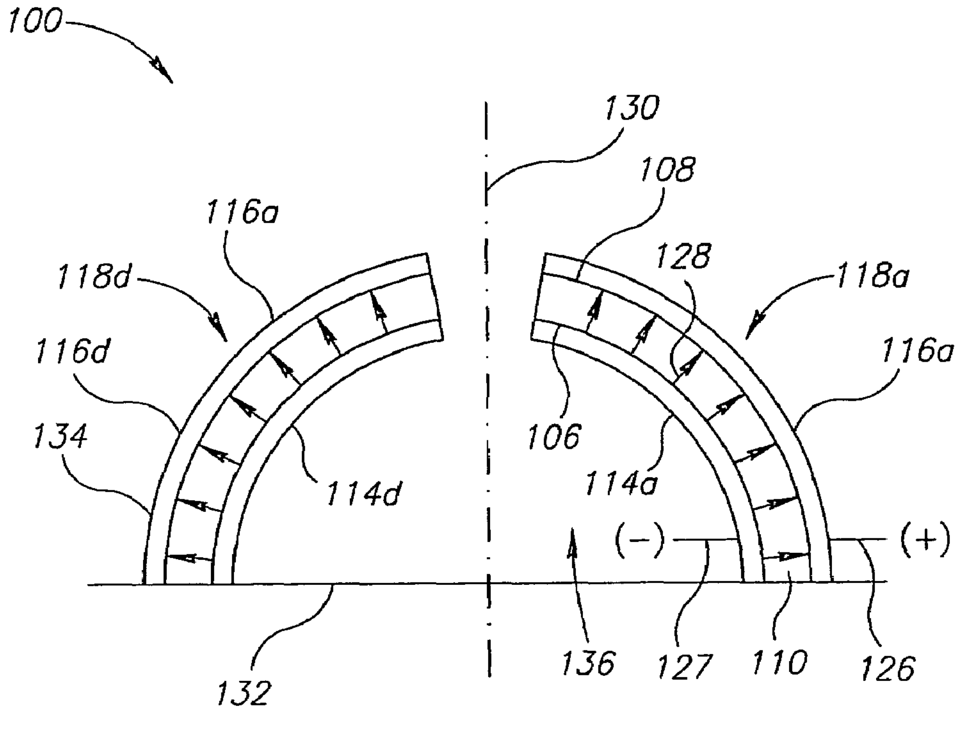
FIG. 2 is vertical cross-sectional view of FIG. 1 showing the polarization of a piezoelectric material in a transducer such as that of FIG. 1.

Referring to FIG. 2, there is shown an enlarged vertical cross-sectional view of transducer 100 illustrated in FIG. 1. Again, for convenient description, it is assumed that transducer 100 is hemispherical (with the longitudinal axis indicated at 130, and the equatorial plane indicated at 132), but it should be understood that spherical cap or other curvatures are also encompassed within the scope of the invention.

Transducer elements 118*a* and 118*d* shown in FIG. 1 are illustrated in FIG. 2. As will therefore be appreciated, the drawing is sectioned along score lines 120*a* and 120*b* (see FIG. 1). As illustrated, terminals 126 and 127 are connected respectively to the outer electrodes 116*a*, 116*b*, . . . and 114*a*, 114*b*, . . . by which the transducer elements 118*a*-118*d* are energized.

Figure 3B:
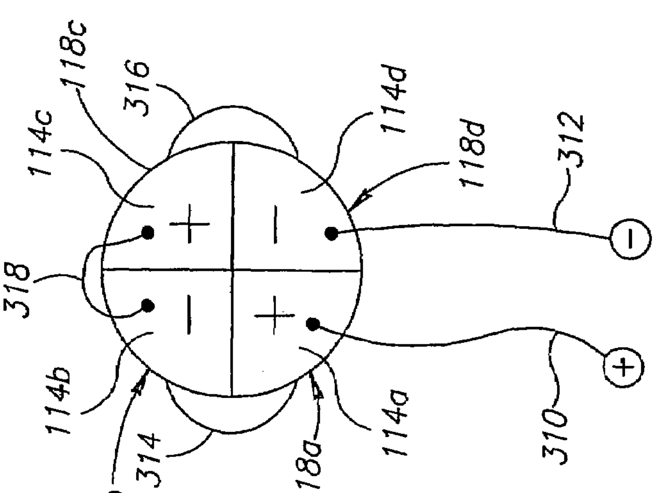
FIG. 3B is a bottom plan view of a transducer showing a schematic wiring layout for the embodiment of FIG. 3A.
Figure 3A:
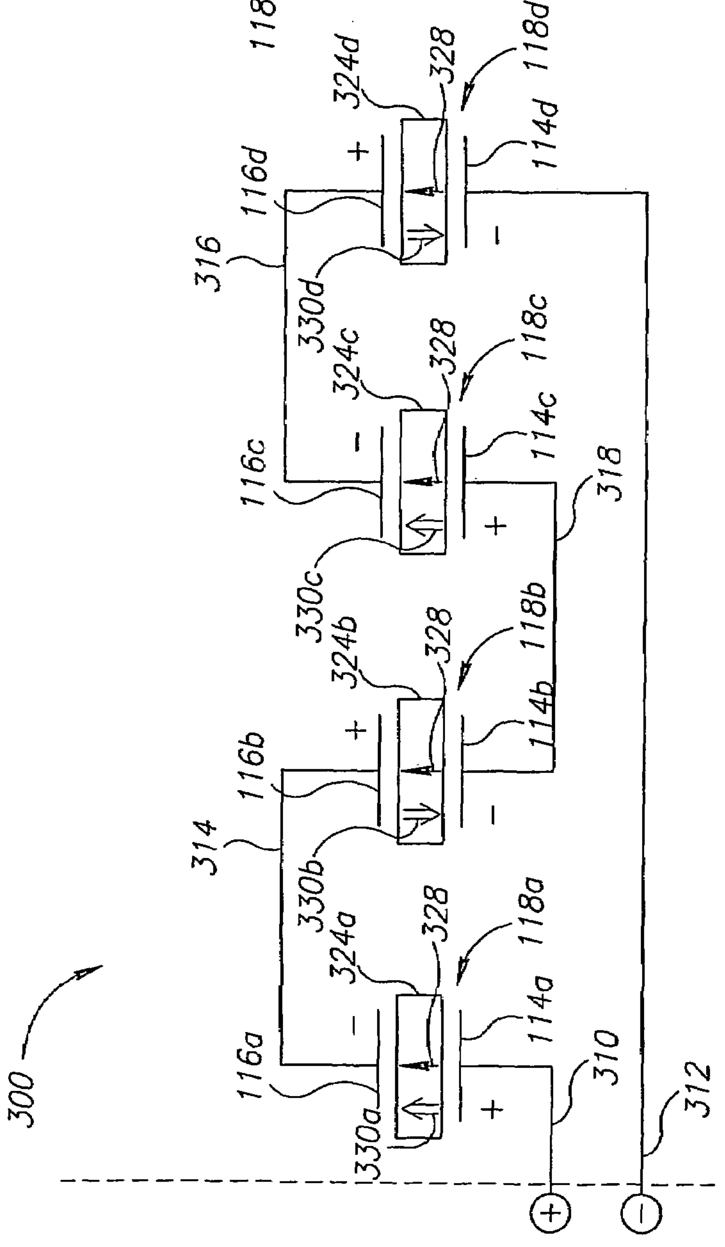
FIG. 3A is an electrical schematic diagram of a first embodiment of the invention.

It should also be appreciated that the outer side 134 of transducer 100 (i.e., the convex side) is conventionally anchored to a suitable mass so that the ultrasound energy emitted by the transducer is mainly directed from the inner, i.e., concave side 136, toward the subject under treatment. As mentioned above, and as known by those skilled in the art, if materials such as PZT are exposed during manufacture to a high-strength electric (polling) field under appropriate conditions, the material will become polarized, i.e., it will exhibit an overall orientation of positive and negative electric charge pairs in the crystal structure of the material which orientation is retained after manufacture. Then, if exposed to an electric field, the material will expand or contract, depending on the direction of the field relative to the direction of polarization. The diametrically extending arrows 128 in FIG. 2 within piezoelectric material 110 schematically indicate polarization direction. For an electric field generated in material 110 parallel or anti-parallel to the polarization direction, the material respectively expands or contracts along the polarization direction. A first embodiment of the invention is illustrated in FIGS. 3A and 3B. FIG. 3A shows an electrical schematic diagram of a transducer 300 having four transducer elements 118*a*-118*d*. Element 118*a*, for example, is comprised of inner electrode 114*a*, outer electrode 116*a*, and an intervening portion 324*a* of shaped piezoelectric body 110 (see FIGS. 1 and 2). Respective transducer elements 118*b*-118*d* are comprised of inner electrodes 114*b*-114*d*, outer electrodes 116*b*-116*d*, and the intervening portions 324*b*-424*d* of piezoelectric body 110.

In the embodiment of FIG. 3A, the transducer elements are connected in series in an alternating field configuration relative to the direction of polarization of the piezoelectric material. To illustrate this conveniently, arrows 328 indicate the direction of polarization, and double arrows 330*a*-330*d* indicate the field direction relative to the direction of polarization. Plus (+) and minus (−) signs at the electrodes of the transducer elements indicate instantaneous voltage drop directions for a voltage having the polarity indicated at input terminals 310 and 312, by which transducer 300 is connected to a power supply (not shown).

Thus, for the illustrated embodiment, terminals 310 and 312 are connected to terminals 114*a* and 114*d* respectively of transducer elements 118*a* and 118*d*. Terminals 116*a* and 116*b* of transducer elements 118*a* and 118*b* are connected together by a signal path 314, and the terminals 114*b* and 114*c* of transducer elements 118*b* and 118*c* are connected together by a signal path 318. Terminals 116*c* and 116*d* of transducer elements 118*c* and 118*d* are connected together by a signal path 316. As a consequence, the induced electric fields in adjacent transducer elements are in opposite (alternating) directions, and the mechanical vibrations generated by adjacent sectors are 180° are out of phase relative to each other. FIG. 3B shows a schematic bottom plan view of transducer 300 and an exemplary wiring layout by which the electrical configuration of FIG. 3A may be achieved. In the figure, electrodes 114*a*-114*d* on the concave, bottom side of the transducer elements 118*a*-118*d*, respectively, are shown.

The embodiment illustrated in FIGS. 3A and 3B exhibits a circumferential focal pattern with one peak for each transducer element. In addition, since the impedance of N like circuit elements connected in series is related to N times the impedance of a single element while the impedance of N such elements connected in parallel is related to 1/N times the impedance of a single element, the four-element series-connected transducer illustrated in FIG. 3 exhibits electrical impedance which can be 16 times that of conventional transducers having the same elements connected in parallel.

Figure 4B:
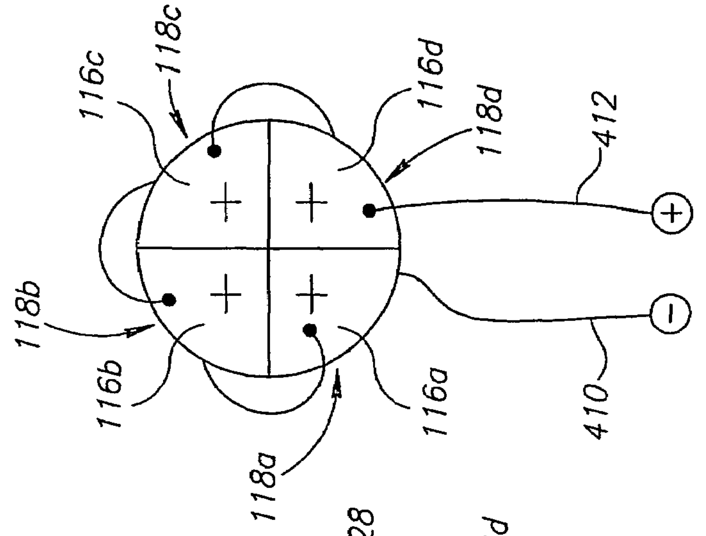
FIG. 4B is a top plan view of a transducer showing a schematic wiring layout for the embodiment of FIG. 4A.
Figure 4A:
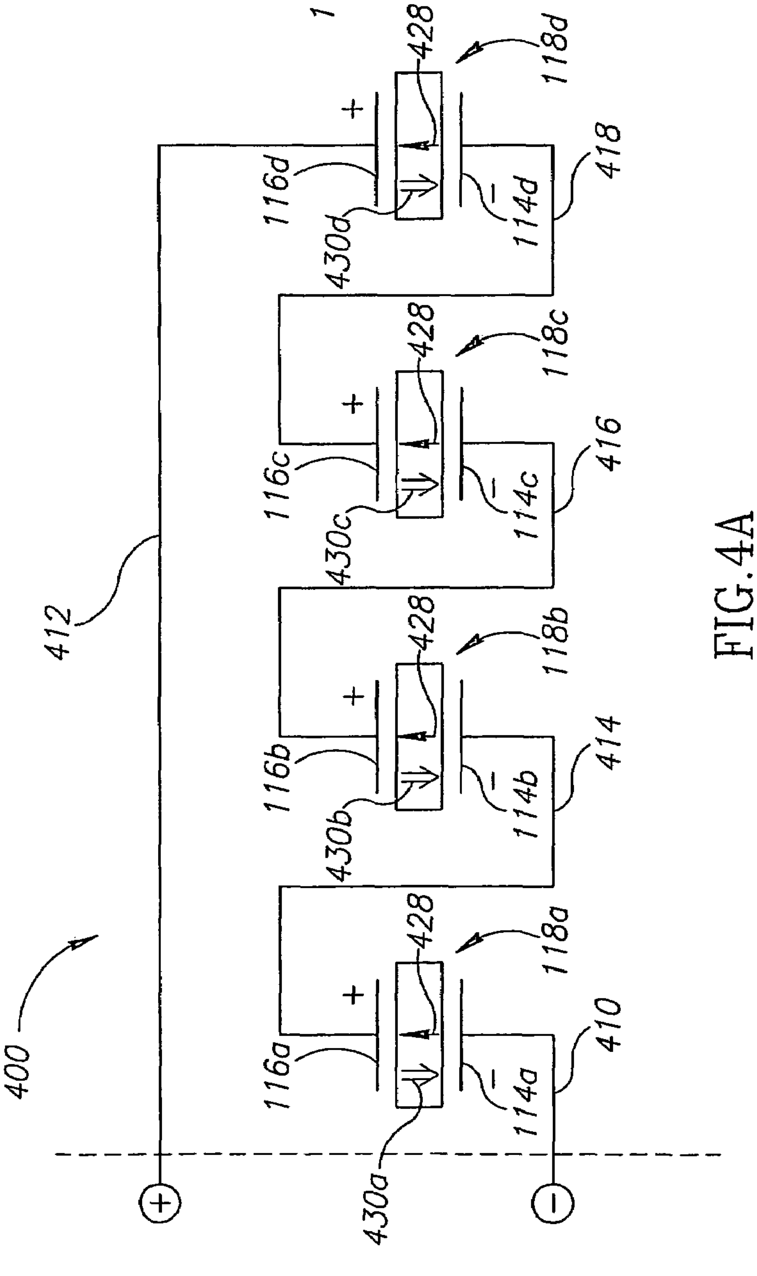
FIG. 4A is an electrical schematic diagram of a second embodiment of the invention.

A second embodiment of the invention is illustrated in FIGS. 4A and 4B. Here, a four-element transducer 400 is arranged with its elements 118*a*-118*d* connected in series in matched field configuration. Thus, input leads 410 and 412 are connected respectively to the "−" side terminal 116*a* of element 118*a*, and the "+" side terminal 116*d* of element 118*d*. Likewise, the "+" side terminal 116*a* of element 118*a* is connected to the "−" side terminal 11 4*b* of element 118*b* by signal path 414, the "+" side terminal 116*b* of element 118*b* is connected to the "−" side terminal 114*c* of element 118*c* by a signal path 416, and the "+" side terminal 116*c* of element 118*c* is connected to the "−" side terminal 114*d* of element 118*d* by a signal path 418. As a consequence, the electric fields (indicated by double arrows 430*a*-430*d*) are in the same direction relative to the polarization of the piezoelectric material (indicated by single arrows 428) in all of the transducer elements, and the mechanical vibrations generated by all the elements are in phase relative to each other. FIG. 4B is a schematic top plan view of transducer 400 which shows electrodes 116*a*-116*d*, and an exemplary wiring layout by which the electrical configuration of FIG. 4A may be achieved.

The embodiment illustrated in FIGS. 4A and 4B exhibits an axial focal pattern, i.e., having one peak along the transducer axis. In addition, like the embodiment of FIGS. 3A and 3B, the impedance can be 16 times that of prior art transducers in which the elements are connected in parallel. In some instances, it is desirable to be able to switch a transducer between the alternating field configuration of FIGS. 3A and 3B and the matched field configuration of FIGS. 4A and 4B. This can be achieved by connecting the input terminals (designated as 310 and 312 in FIGS. 3A and 3B and as 410 and 412 in FIGS. 4A and 4B) and the signal paths between the transducer elements through an appropriate switching circuit as illustrated schematically in FIG. 7.

Here, a four-element transducer such as transducer 300 illustrated in FIG. 3A (or transducer 400 illustrated in FIG. 4A) has its elements 118*a*-118*d* connected to a switching circuit 702. Terminals PS1 and PS2 by which a power supply (not shown) is connected to energize the transducer are provided on switching circuit 702, and also a set of control terminals C1 . . . Cn. As will be understood by those skilled in the art, there are numerous suitable internal configurations for switching circuit 702, and details of such configurations are omitted in the interest of brevity.

Figure 7:
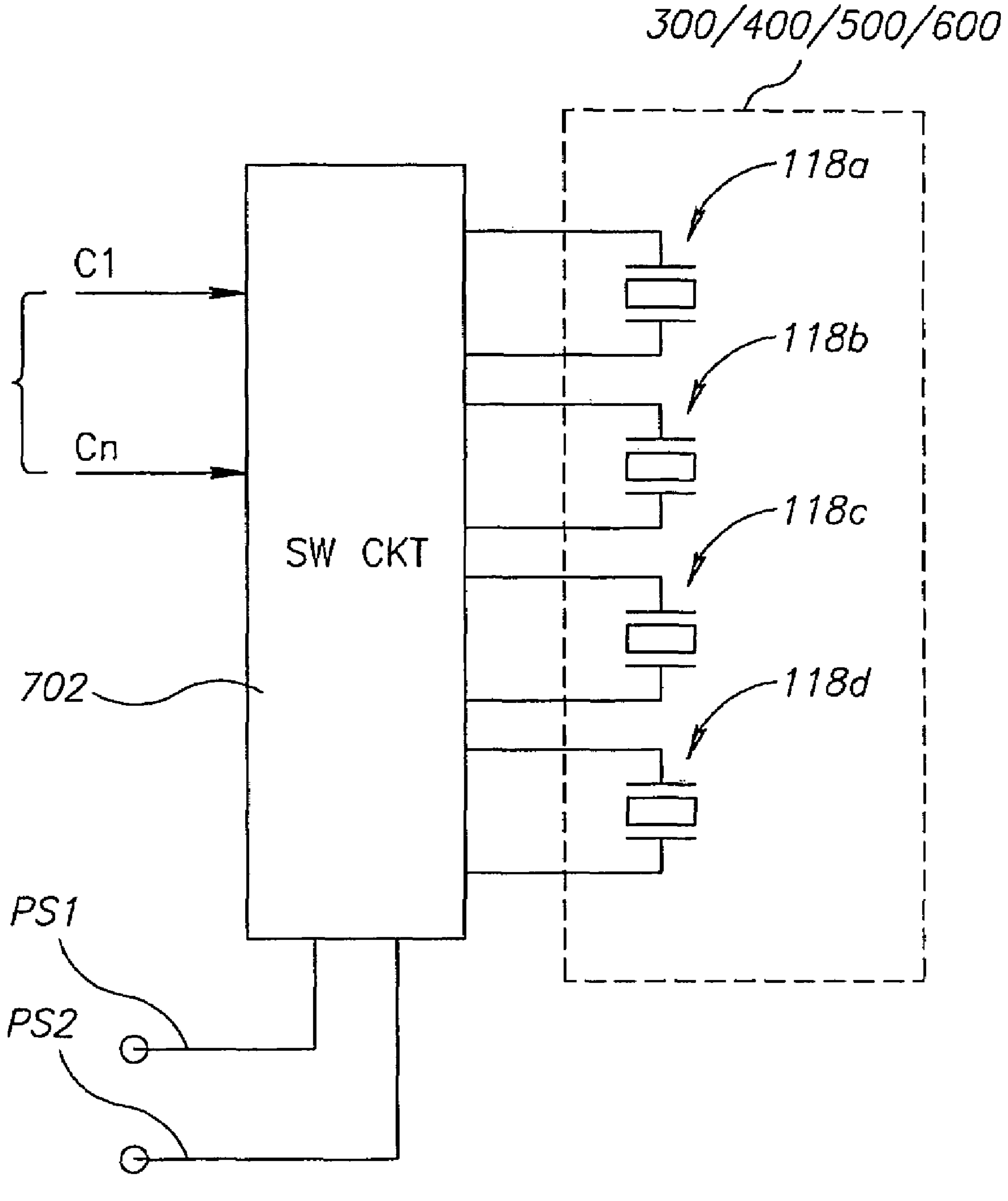
FIG. 7 is a schematic diagram showing connection of a multi-element transducer to a switching circuit.

Using a switching circuit as illustrated in FIG. 7, it is possible to switch between series-connected alternating and matched field configurations as shown in FIGS. 3A and 4A to selectably obtain an axial or circumferential focal pattern.

Using such a switching circuit with appropriate internal connections, it is also possible to obtain alternating and matched field configurations in which the transducer elements are connected in parallel. An alternating field configuration, with the transducer elements connected in parallel, is illustrated in FIGS. 5A and 5B.

Here, a four-element transducer 500 having the same piezoelectric transducer element configuration as illustrated in FIGS. 3A and 4A, is arranged so that a first power supply terminal 510 is connected to the "+" side terminals 116*a* and 116*c* of transducer elements 118*a* and 118*c*, and to the "−" side electrodes 114*b* and 114*d* of transducer elements 118*b* and 118*d*. A second power supply terminal 512 is connected to the "–" side terminals 114*a* and 114*c* of transducer elements 118*a* and 118*c*, and the "+" side terminals 116*b* and 116*d* of transducer elements 118*b* and 118*d*. As in the case of transducer 300 (see FIG. 3), the induced electric fields (indicated by double arrows 530*a*-530*d*) are in opposite directions relative to the polarization of the piezoelectric material in adjacent transducer elements (indicated by single arrows 528), and the mechanical vibrations generated by adjacent transducer elements are 180° out of phase relative to each other. FIG. 5B shows a top plan view of transducer 500, with electrodes 116*a*-116*d* visible, and an exemplary wiring layout by which the electrical configuration of FIG. 5A may be achieved.

Figure 5B:
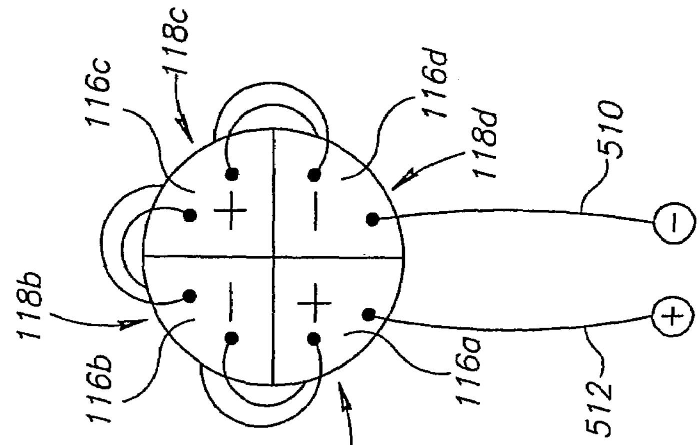
FIG. 5B is a top plan view of a transducer showing a schematic wiring layout for the arrangement of FIG. 5A.
Figure 5A:
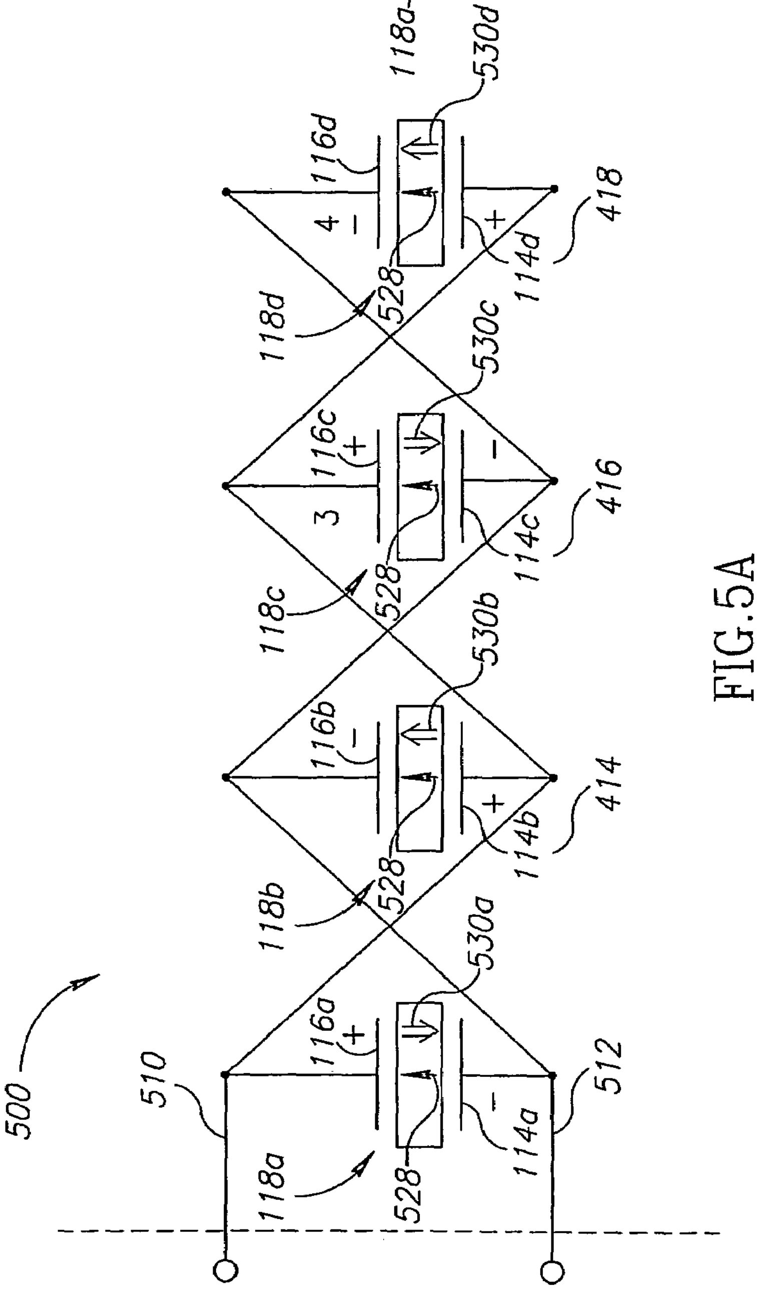
FIG. 5A is an electrical schematic diagram showing how a transducer according to the first embodiment of the invention can be connected in a parallel arrangement.

The arrangement illustrated in FIGS. 5A and 5B exhibits a circumferential focal pattern with one peak for each transducer segment. However, its electrical impedance is lower by a factor of about 16 as explained above compared to that of the series connected configuration shown in FIGS. 3A and 3B.

The configuration of FIGS. 5A and 5B can readily be provided for in the design of switching circuit 702, as will be apparent to those skilled in the art in light of the description herein.

Figure 6B:
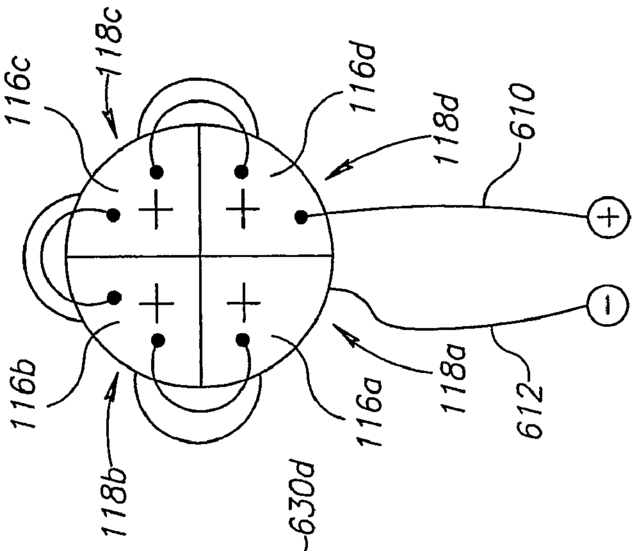
FIG. 6B is a top plan view of a transducer showing a schematic wiring layout for the arrangement of FIG. 6A.

A parallel-connected transducer having a matched-field configuration may also be provided for in the design of switching circuit 702. Such a transducer configuration is shown at 600 in FIGS. 6A and 6B. Here, power supply terminals 610 and 612 are respectively connected to the "+" and "–" side terminals 116*a*-116*d* and 114*a*-114*d* of all the transducer elements 118*a*- 118*d*. As in the embodiment of FIG. 4, the electric fields (indicated by double arrows 630*a*-630*d*) are in the same direction relative to the polarization of the piezoelectric material (indicated by single arrows 628) in all of the transducer elements, and the mechanical vibrations generated by all the elements are in phase relative to each other. FIG. 6B shows a top plan view of transducer 600, with electrodes 116*a*-116*d* visible, and an exemplary wiring layout by which the electrical configuration of FIG. 6A may be achieved.

Figure 6A:
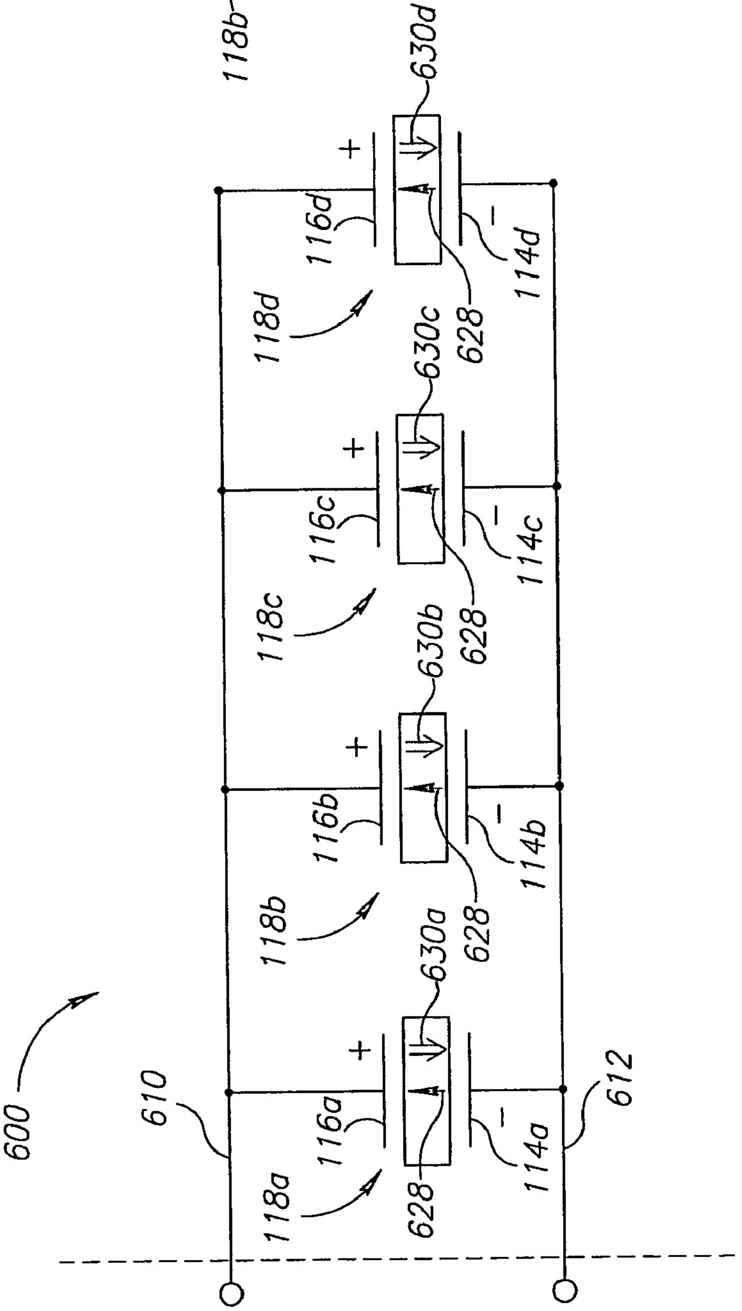
FIG. 6A is an electrical schematic diagram showing how a transducer according to the second embodiment of the invention can be connected in a parallel arrangement.

The configuration of FIGS. 6*a* and 6B is characterized by an axial focal pattern and electrical impedance at 1 MHz that is lower than that of the corresponding serially connected transducer of FIGS. 4A and 4B by a factor of 16.

From the foregoing description, it will readily be appreciated that desirable electrical impedance levels can be achieved according to the invention by taking advantage of the polarization of piezoelectric ceramic material and by connecting a segmented transducer with the elements in series, either in an alternating polarization configuration or in a matched polarization configuration.

Quite apart from the above-stated benefit of the invention, by the use of a switching circuit of straightforward design, the same multi-element transducer construction can be used to provide both alternating and matched polarization configurations, and to provide these configurations with series-connected elements or parallel-connected elements, thereby achieving flexibility in selection of both focal patterns, and electrical impedance.

There are also other ways in which some of the concepts of the invention can be applied. For example, while the transducers discussed above are all constructed of four elements, any other desired even numbers of elements are also possible. As will be appreciated, as the number of elements is increased, the relative increase in impedance for series-connected arrangements compared to parallel-connected arrangements will be larger.

Figure 8:
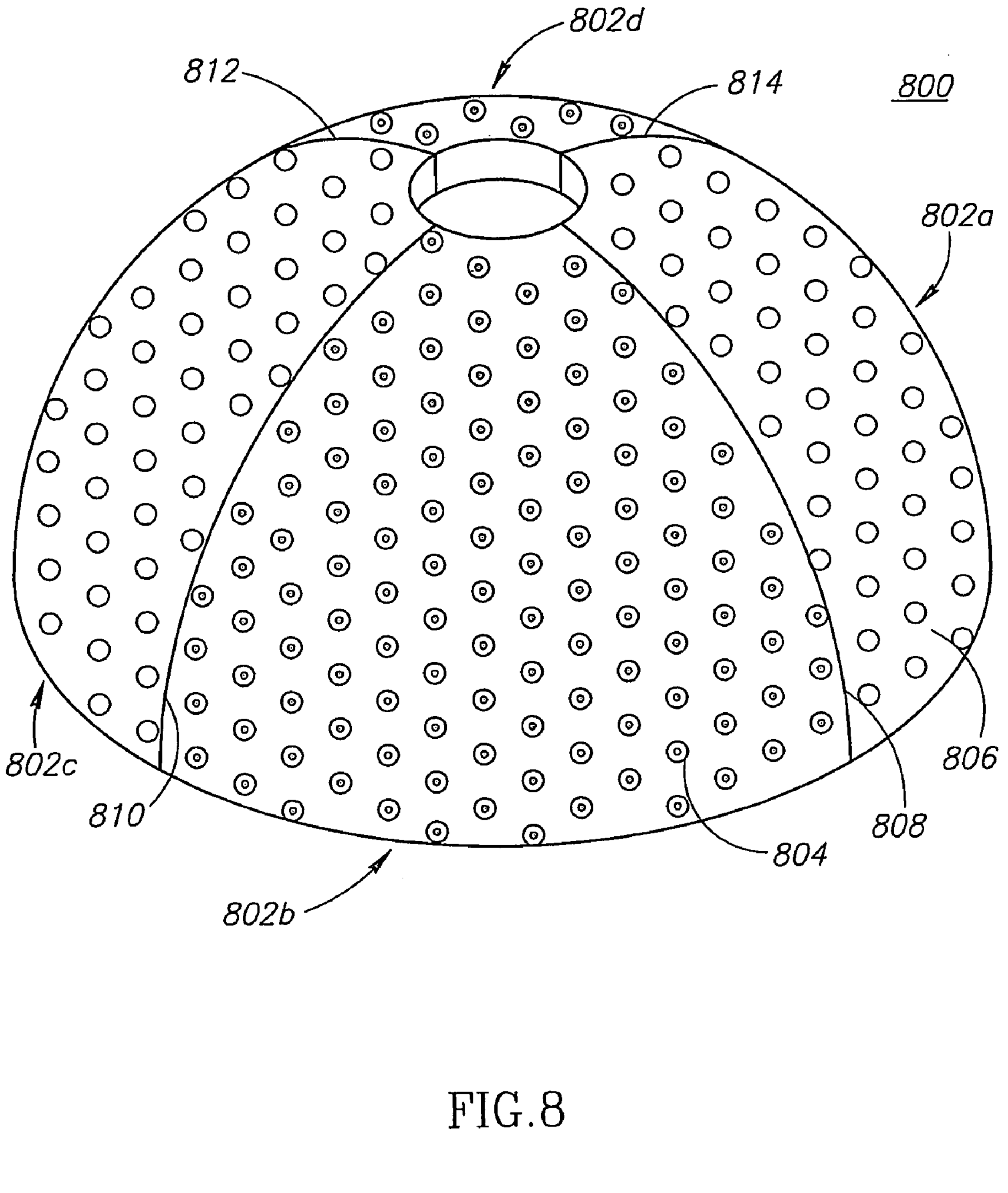
FIG. 8 is a perspective drawing showing an alternative way of achieving the focal patterns of multi-element piezoelectric transducers according to the first embodiment of the invention.

Using some of the concepts of the invention, it is also possible to obtain a multiple-element transducer having an alternating field configuration without the need for multiple isolated electrode pairs. One way to accomplish this is illustrated in FIG. 8, which shows an outside perspective view of a cup-shaped hemispherical piezoelectric body 800 without an outer electrode.

Here piezoelectric body 800, instead of being formed with a uniform direction of polarization, is formed with four adjacent zones of alternating polarization 802*a*, 802*b*, 802*c*, and 802*d* (or any other desired even number of alternating zones). This may be done, for example, by applying a suitable electric polling field with the desired polarity to each zone. Appropriate ways to accomplish this will be apparent to those skilled in the art.

For convenience, the polarization direction of zones 802*a* and 802*c* is indicated by circles, and the opposite direction polarization of zones 802*b* and 802*d* is indicated by dots surrounded by circles. It is to be understood that the change in polarization at the zone boundaries is not necessarily sharply defined, so the change may be gradual. (Lines 804, 806, 808, and 810 in FIG. 8 demarcating the zone boundaries are for illustration only, and are not part of the actual structure.)

After body 800 has been polarized, inner and outer metallic coatings are applied, as previously described, but optionally, coatings are not scored to create separate electrode pairs. In that event, there is a single inner electrode and a single outer electrode (not shown). Thus, for a given voltage polarity applied to the transducer, the field direction does not reverse from zone to zone, but because the direction of polarization of body 800 alternates between zones, and a circumferential focal pattern is achieved.

It should be noted that, for a configuration having single inner and outer electrodes, the transducer elements are connected in parallel, as in the arrangement of FIGS. 5A and 5B. The transducer impedance is thus lower than in the embodiment of FIGS. 3A and 3B, but the construction is somewhat simpler, and there is no concern about the effects of relatively high potential differences on adjacent electrode elements. To obtain the higher impedance levels associated with the embodiment of FIGS. 3A and 3B, the inner and outer conductive coatings can be scored to create isolated electrode-pairs, and the resulting elements connected in series. In this regard, it should be recognized that with the polarization arrangement shown in FIG. 8, for a series-connected transducer, the individual elements should be connected as illustrated in FIGS. 4A and 4B.

The transducers described above are characterized by elements shaped as hemispherical triangles, but the invention is not limited to such element shapes. For example, reference is made to copending U.S. patent application Ser. No. 11/870,445, filed Oct. 11, 2007 in the name of Andrey Rybyanets, the entire content of which is hereby incorporated herein by reference as if fully set forth. In the Rybyanets application, there is shown a transducer in which the piezoelectric body has a single direction of polarization like that of FIG. 3A etc. herein, but the isolated electrodes are in the shape of crescents. When connected in an alternating field configuration, a propeller or pinwheel focal pattern is obtained.

Figure 9:
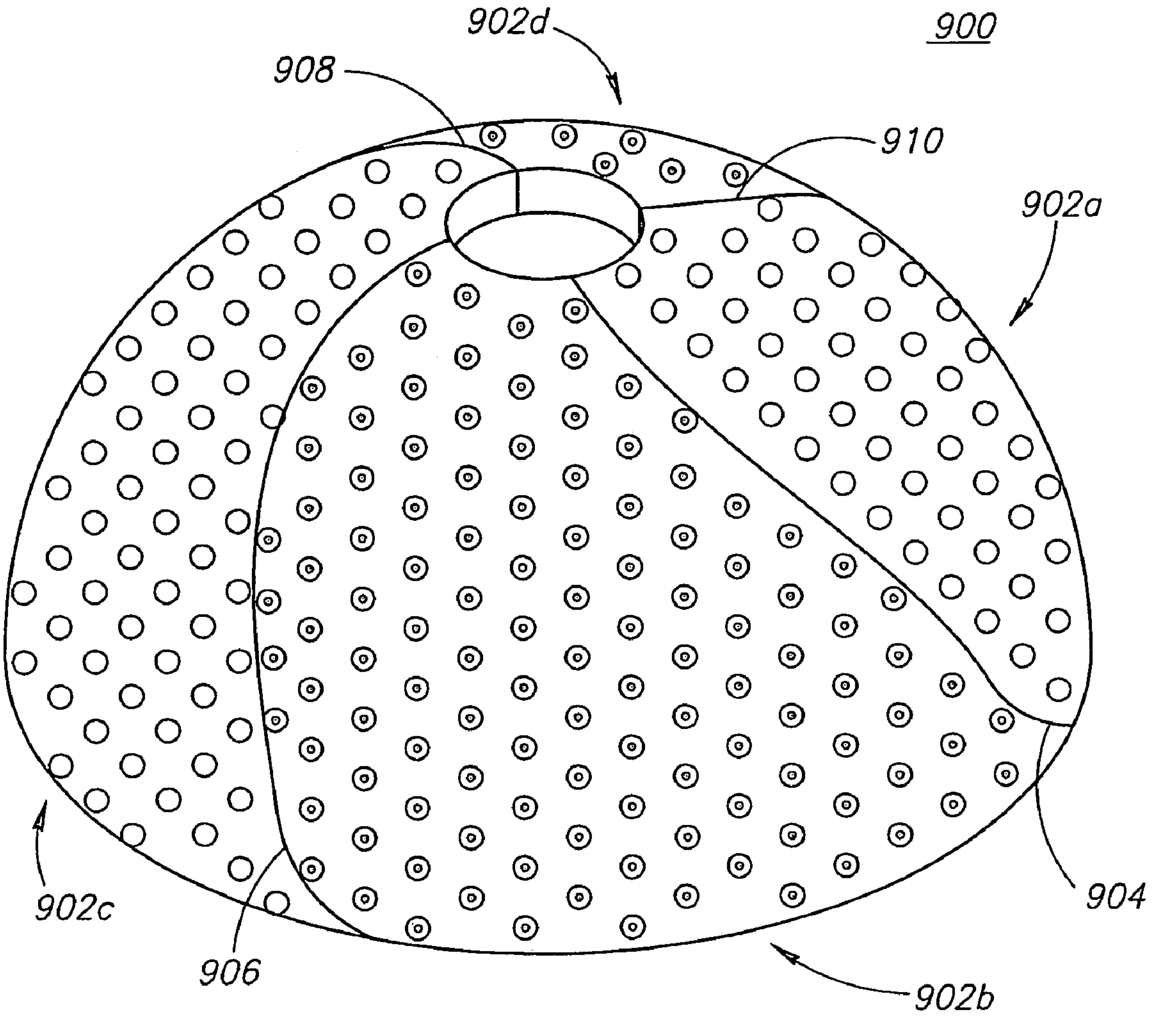
FIG. 9 is a perspective drawing similar to FIG. 8 illustrating how some of the concepts of the invention can be applied to a multi-element transducer configuration that is different from that of the first and second embodiments.

A similar pattern can be obtained with a multi-element transducer of the kind shown in FIG. 9, with the same notation used in FIG. 8 for indicating the direction of polarization. Here, a transducer 900 may be provided in which body zones 902*a*, 902*b*, 902*c*, and 902*d* are themselves crescent-shaped, rather than spherical triangles. As in FIG. 8, optionally continuous outer and inner electrodes (not shown) are provided, but due to the alternating polarization pattern in the adjacent zones 902*a*-902*d*, a multi-element transducer is achieved. Like the transducers of the Rybyanets application, the acoustical focal pattern is in the shape of a propeller or a pinwheel. Again four zones are shown, but any even number is possible. As in FIG. 8, demarcation lines 904, 906, 908, and 910 showing the zone boundaries are for illustration only, and are not part of the actual structure.

Figure 10:
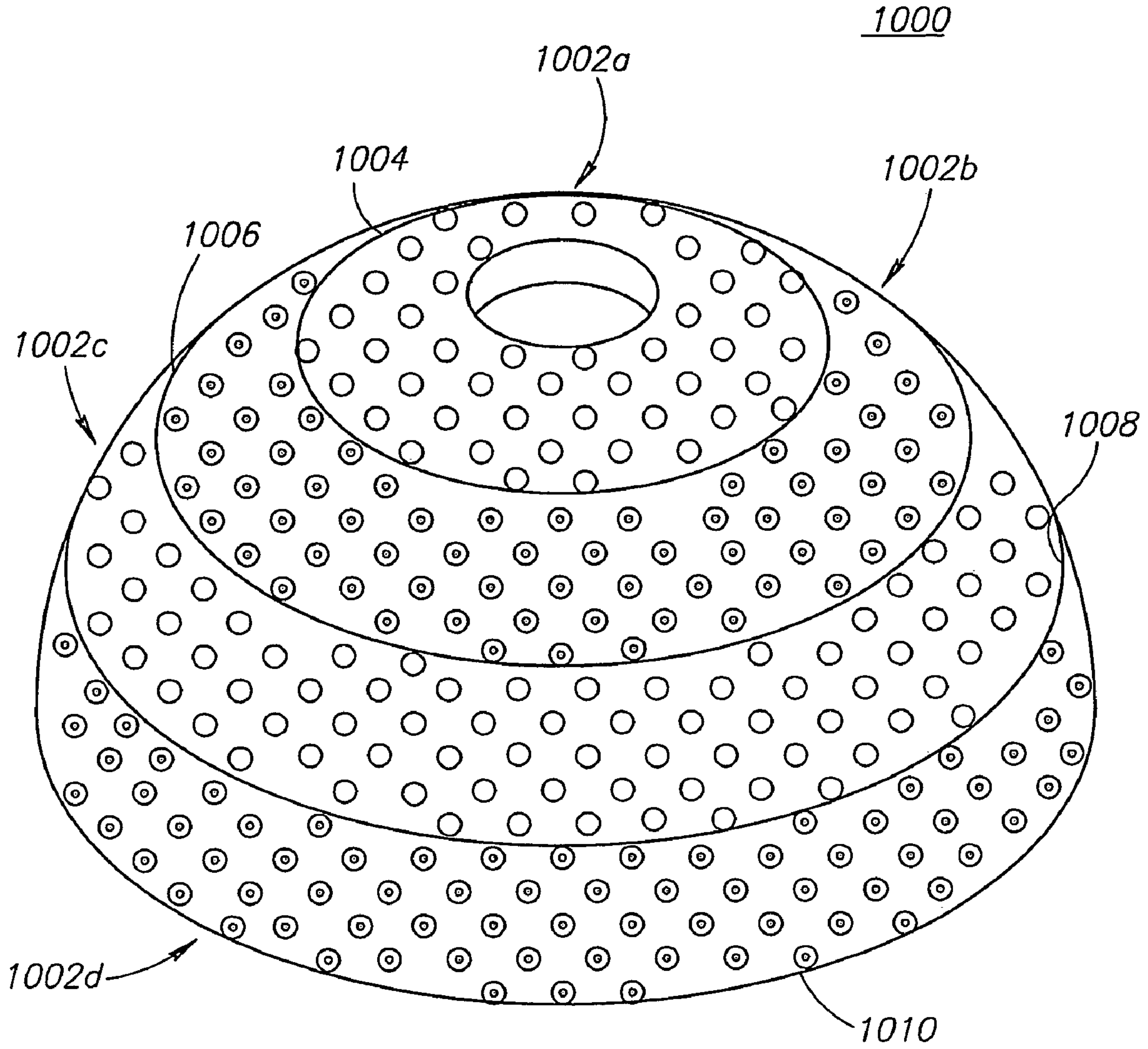
FIG. 10 is a perspective drawing similar to FIGS. 8 and 9 illustrating application of some of the concepts of the invention to a multi-element transducer having another configuration that is different from that of the first and second embodiments.

Yet another variation employing the concepts of FIGS. 8 and 9 is shown in FIG. 10 at 1000. Again, the same notation used in FIG. 8 is used here to indicate the direction of polarization. In the variation of FIG. 10, the polarization zone 1002*a* is shown as a spherical cap, or more generally, as a cup-shaped cap, and zones 1002*b*, 1002*c*, and 1002*d* are shown as annuli, or more generally, as solid annuli, arranged below zone 1002*a*. Demarcation lines 1004, 1006, and 1008 are for illustration only and not part of the actual structure. As will be understood, line 1010 represents the outer margin at the bottom of the transducer.

It should also be noted that the transducers described in connection with FIGS. 8 and 9 can be modified to incorporate isolated electrode pairs and combined with a switching circuit if desired to permit selection between non-axial and axial focal patterns. The transducer of FIG. 10 can be similarly modified.

The invention has been described with reference to embodiments thereof that are provided by way of example and are not intended to limit the scope of the invention. The described embodiments comprise different features, not all of which are required in all embodiments of the invention. Some embodiments of the invention utilize only some of the features or possible combinations of the features. Variations of embodiments of the described invention and embodiments of the invention comprising different combinations of features than those noted in the described embodiments will occur to persons of the art. The scope of the invention is limited only by the following claims.

What is claimed is:

1. A piezoelectric transducer comprising:

a body of piezoelectric material having first and second opposed sides;

first and second electrically conductive layers on the first and second sides respectively of the piezoelectric body; and a switching arrangement operative to connect the transducer elements together in series, either in a matched field configuration or in an alternating field configuration;

wherein the body of piezoelectric material and the electrically conductive layers are so constructed that they form a plurality of separate adjacent series-connected transducer elements, and wherein the first and second electrically conductive layers are comprised of respective pluralities of first and second electrically isolated portions, and wherein respective ones of said first and second electrically isolated portions are aligned to form electrode pairs which cooperate with intervening portions of the piezoelectric body to define the plurality of spaced piezoelectric transducer elements, and wherein the transducer elements are so arranged that a potential difference applied thereto generates an electric field in opposite directions in immediately adjacent transducer elements relative to a polarization direction of the piezoelectric material.

2. A piezoelectric transducer according to claim 1, wherein:

the first and second electrically conductive layers extend substantially continuously over a portion of the body of piezoelectric material; and the adjacent series-connected transducer elements are defined by adjacent zones of alternating polarization direction in the piezoelectric material between the conductive layers.

3. A transducer as defined in claim 2, wherein the piezoelectric body is hemispherical in shape, and the adjacent zones of the piezoelectric body are in the shape of spherical triangles separated by spaced meridians of the hemispherical body.

4. A transducer as defined in claim 1, wherein the piezoelectric body is in the form of a spherical cap.

5. A transducer as defined in claim 2, wherein the piezoelectric body is cup-shaped, and the adjacent zones of the piezoelectric body are crescent-shaped.

6. A transducer as defined in claim 2, wherein the piezoelectric body is cup-shaped, with a first one of the adjacent zones of the piezoelectric body forming a cap, and the zones other than the first zone being annular.

7. A piezoelectric transducer according to claim 1 wherein, in the matched field configuration, first and second electrodes of adjacent transducer elements are connected together.

8. A piezoelectric transducer according to claim 1 wherein, in the alternating field configuration, the first electrodes of at least one pair of adjacent transducer elements are connected together.

9. A piezoelectric transducer according to claim 1 wherein, in the alternating field configuration, the electrical connections connect second electrodes of at least one pair of adjacent transducer elements together.

10. A piezoelectric transducer according to claim 9, wherein in the alternating field configuration, transducer element pairs having their first electrodes connected together are interleaved with transducer element pairs having their second electrodes connected together.

11. A transducer as defined in claim 1, wherein the electrically isolated portions are defined by a plurality of aligned discontinuities between adjacent portions of the conductive layers.

12. A transducer as defined in claim 11, wherein the piezoelectric body is hemispherical in shape, and the aligned discontinuities extend along spaced meridians of the hemispherical body.

13. A transducer as defined in claim 11 wherein the piezoelectric body is in the form of a spherical cap.

14. A piezoelectric transducer comprising:

a body of piezoelectric material having first and second opposed sides;

first and second electrically conductive layers on the first and second sides respectively of the piezoelectric body; and a switching arrangement operative to connect the transducer elements together in series, either in a matched field configuration or in an alternating field configuration;

wherein the body of piezoelectric material and the electrically conductive layers are so constructed that they form a plurality of separate adjacent series-connected transducer elements, and wherein the first and second electrically conductive layers are comprised of respective pluralities of first and second electrically isolated portions, and wherein respective ones of said first and second electrically isolated portions are aligned to form electrode pairs which cooperate with intervening portions of the piezoelectric body to define the plurality of spaced piezoelectric transducer elements, and wherein the electrodes are so connected together that the transducer elements are connected in a first series configuration in which an applied potential difference generates an electric field in the same direction in each transducer element relative to a polarization direction of the piezoelectric material.

15. A piezoelectric transducer according to claim 14, wherein:

the first and second electrically conductive layers extend substantially continuously over a portion of the body of piezoelectric material; and the adjacent series-connected transducer elements are defined by adjacent zones of alternating polarization direction in the piezoelectric material between the conductive layers.

16. A transducer as defined in claim 15 wherein the piezoelectric body is hemispherical in shape, and the adjacent zones of the piezoelectric body are in the shape of spherical triangles separated by spaced meridians of the hemispherical body.

17. A transducer as defined in claim 14, wherein the piezoelectric body is in the form of a spherical cap.

18. A transducer as defined in claim 15 wherein the piezoelectric body is cup-shaped, and the adjacent zones of the piezoelectric body are crescent-shaped.

19. A transducer as defined in claim 15 wherein the piezoelectric body is cup-shaped, with a first one of the adjacent zones of the piezoelectric body forming a cap, and the zones other than the first zone being annular.

20. A piezoelectric transducer according to claim 14 wherein, in the matched field configuration, first and second electrodes of adjacent transducer elements are connected together.

21. A piezoelectric transducer according to claim 14 wherein, in the alternating field configuration, the first electrodes of at least one pair of adjacent transducer elements are connected together.

22. A piezoelectric transducer according to claim 14 wherein, in the alternating field configuration, the electrical connections connect second electrodes of at least one pair of adjacent transducer elements together.

23. A piezoelectric transducer according to claim 22 wherein, in the alternating field configuration, transducer element pairs having their first electrodes connected together are interleaved with transducer element pairs having their second electrodes connected together.

24. A transducer as defined in claim 14, wherein the electrically isolated portions are defined by a plurality of aligned discontinuities between adjacent portions of the conductive layers.

25. A transducer as defined in claim 24 wherein the piezoelectric body is hemispherical in shape, and the aligned discontinuities extend along spaced meridians of the hemispherical body.

26. A transducer as defined in claim 24 wherein the piezoelectric body is in the form of a spherical cap.

* * * * *